(12) United States Patent
Lee et al.

(10) Patent No.: US 12,394,460 B2
(45) Date of Patent: Aug. 19, 2025

(54) NONVOLATILE MEMORY DEVICE AND MEMORY SYSTEM INCLUDING THE SAME

(71) Applicant: Samsung Electronics Co., Ltd., Suwon-si (KR)

(72) Inventors: Cheolhui Lee, Suwon-si (KR); Youngmin Jo, Suwon-si (KR); Anil Kavala, Suwon-si (KR); Jungjune Park, Suwon-si (KR); Chiweon Yoon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/498,267

(22) Filed: Oct. 31, 2023

(65) Prior Publication Data
US 2024/0274173 A1 Aug. 15, 2024

(30) Foreign Application Priority Data
Feb. 14, 2023 (KR) .................... 10-2023-0019534

(51) Int. Cl.
*G11C 7/14* (2006.01)
*G11C 7/10* (2006.01)
*G11C 7/22* (2006.01)

(52) U.S. Cl.
CPC ............ *G11C 7/222* (2013.01); *G11C 7/1081* (2013.01); *G11C 7/14* (2013.01); *G11C 7/225* (2013.01)

(58) Field of Classification Search
CPC ......... G11C 7/222; G11C 7/1081; G11C 7/14; G11C 7/225; G11C 29/021; G11C 29/028; G11C 11/4074; G11C 11/4082; G11C 16/30; G11C 5/147; G11C 16/10; G06F 3/061; G06F 3/0658; G06F 3/0679; H03K 5/19
See application file for complete search history.

(56) References Cited

U.S. PATENT DOCUMENTS

| 8,456,928 B2 | 6/2013 | Mutnury et al. |
| 9,659,608 B2 | 5/2017 | Jung |

(Continued)

FOREIGN PATENT DOCUMENTS

KR 10-2017-0112272 A 10/2017

*Primary Examiner* — Xiaochun L Chen
(74) *Attorney, Agent, or Firm* — Harness, Dickey & Pierce, P.L.C.

(57) ABSTRACT

Provided is a nonvolatile memory including a receive buffer configured to generate a buffer signal by comparing an input signal with a reference voltage, a reference voltage calibrator configured to generate a calibrated reference voltage code signal based on a reference voltage code signal and the buffer signal, and a reference voltage generator configured to generate a reference voltage corresponding to the calibrated reference voltage code signal. In addition, the read reference voltage calibrator includes a duty cycle monitor configured to generate a monitoring signal by measuring a duty cycle of the buffer signal, an up/down counter configured to generate a count number signal by comparing a reference duty cycle with a measurement duty cycle corresponding to the monitoring signal, and a code calculator configured to generate the calibrated reference voltage code signal based on the count number signal and the reference voltage code signal.

20 Claims, 11 Drawing Sheets

(56) References Cited

U.S. PATENT DOCUMENTS

| | | | |
|---|---|---|---|
| 9,711,189 B1* | 7/2017 | Wang | G11C 29/028 |
| 10,014,039 B2 | 7/2018 | Lee et al. | |
| 10,824,575 B2 | 11/2020 | Lee et al. | |
| 11,232,818 B2 | 1/2022 | Bae | |
| 11,244,711 B2 | 2/2022 | Tsuji | |
| 2008/0080261 A1* | 4/2008 | Shaeffer | H01L 25/105 |
| | | | 365/189.05 |
| 2022/0093161 A1 | 3/2022 | Eom et al. | |

* cited by examiner

_US 12,394,460 B2_

NONVOLATILE MEMORY DEVICE AND MEMORY SYSTEM INCLUDING THE SAME

CROSS-REFERENCE TO RELATED APPLICATION

This application is based on and claims priority under 35 U.S.C. § 119 to Korean Patent Application No. 10-2023-0019534, filed on Feb. 14, 2023, in the Korean Intellectual Property Office, the disclosure of which is incorporated by reference herein in its entirety.

BACKGROUND

The inventive concepts relate to nonvolatile memory devices, and more particularly, to nonvolatile memory devices capable of performing a self-training operation of an internal channel reference voltage during a training operation for a buffer device, and memory systems including the nonvolatile memory device.

Due to development of memory technology, memory systems capable of writing and reading a large amount of data have been proposed. In such a case, a plurality of memory devices are connected to a memory controller included in a memory system, so that a memory operation including write and read operations is controlled. However, in a structure in which a plurality of memory devices are connected to one memory controller, the memory controller has a high output impedance, and thus, signals output from the memory controller do not adequately reach each of the memory devices.

To solve this issue, a structure in which a buffer device is connected between the memory controller and the plurality of memory devices is employed, so that the buffer device drives signals received from the memory controller and transmits the signals to the memory devices adequately.

The memory controller, after power on, performs training operations for the buffer device and a nonvolatile memory, to identify channel characteristics between the memory controller and the buffer device and channel characteristics between the buffer device and the nonvolatile memory.

As described above, research has been conducted to effectively perform training operations for a plurality of nonvolatile memories in a memory system structure including a buffer device.

SUMMARY

The inventive concepts provide nonvolatile memories capable of performing internal channel reference voltage self-training between a buffer device and the nonvolatile memory during a training operation for the buffer device, and memory systems including the nonvolatile memories.

According to some aspects of the inventive concepts, there is provided a nonvolatile memory including a receive buffer configured to generate a buffer signal by comparing an input signal with a reference voltage, a reference voltage calibrator configured to generate a calibrated reference voltage code signal based on a reference voltage code signal and the buffer signal, and a reference voltage generator configured to generate a reference voltage corresponding to the calibrated reference voltage code signal, wherein the reference voltage calibrator includes a duty cycle monitor configured to generate a monitoring signal by measuring a duty cycle of the buffer signal, an up/down counter configured to generate a count number signal by comparing a reference duty cycle with a measurement duty cycle corresponding to the monitoring signal, and a code calculator configured to generate the calibrated reference voltage code signal based on the count number signal and the reference voltage code signal.

According to some aspects of the inventive concepts, there is provided a memory system including a plurality of nonvolatile memories, a memory controller configured to control operations for the plurality of nonvolatile memories, and a buffer device connected between the plurality of nonvolatile memories and the memory controller, wherein each of the plurality of nonvolatile memories includes a first receive buffer configured to generate a first buffer signal by comparing a first input signal received from the buffer device with a first reference voltage, a write reference voltage calibrator configured to generate a first calibrated reference voltage code signal based on a first reference voltage code signal and the first buffer signal, and a first reference voltage generator configured to generate a first reference voltage corresponding to the first calibrated reference voltage code signal.

According to some aspects of the inventive concepts, there is provided an operating method of a nonvolatile memory, the operating method including receiving write data, generating a buffer signal by comparing the write data with a reference voltage, generating a calibrated reference voltage code signal based on a reference voltage code signal and the buffer signal, and generating a reference voltage corresponding to the calibrated reference voltage code signal, wherein the generating of the calibrated reference voltage code signal includes generating a monitoring signal by measuring a duty cycle of the buffer signal, generating a count number signal by comparing a reference duty cycle with a measurement duty cycle corresponding to the monitoring signal, and generating the calibrated reference voltage code signal based on the count number signal and the reference voltage code signal.

BRIEF DESCRIPTION OF THE DRAWINGS

Example embodiments will be more clearly understood from the following detailed description taken in conjunction with the accompanying drawings in which.

DETAILED DESCRIPTION

Hereinafter, various example embodiments of the inventive concepts are described with reference to the accompanying drawings.

Figure 1:
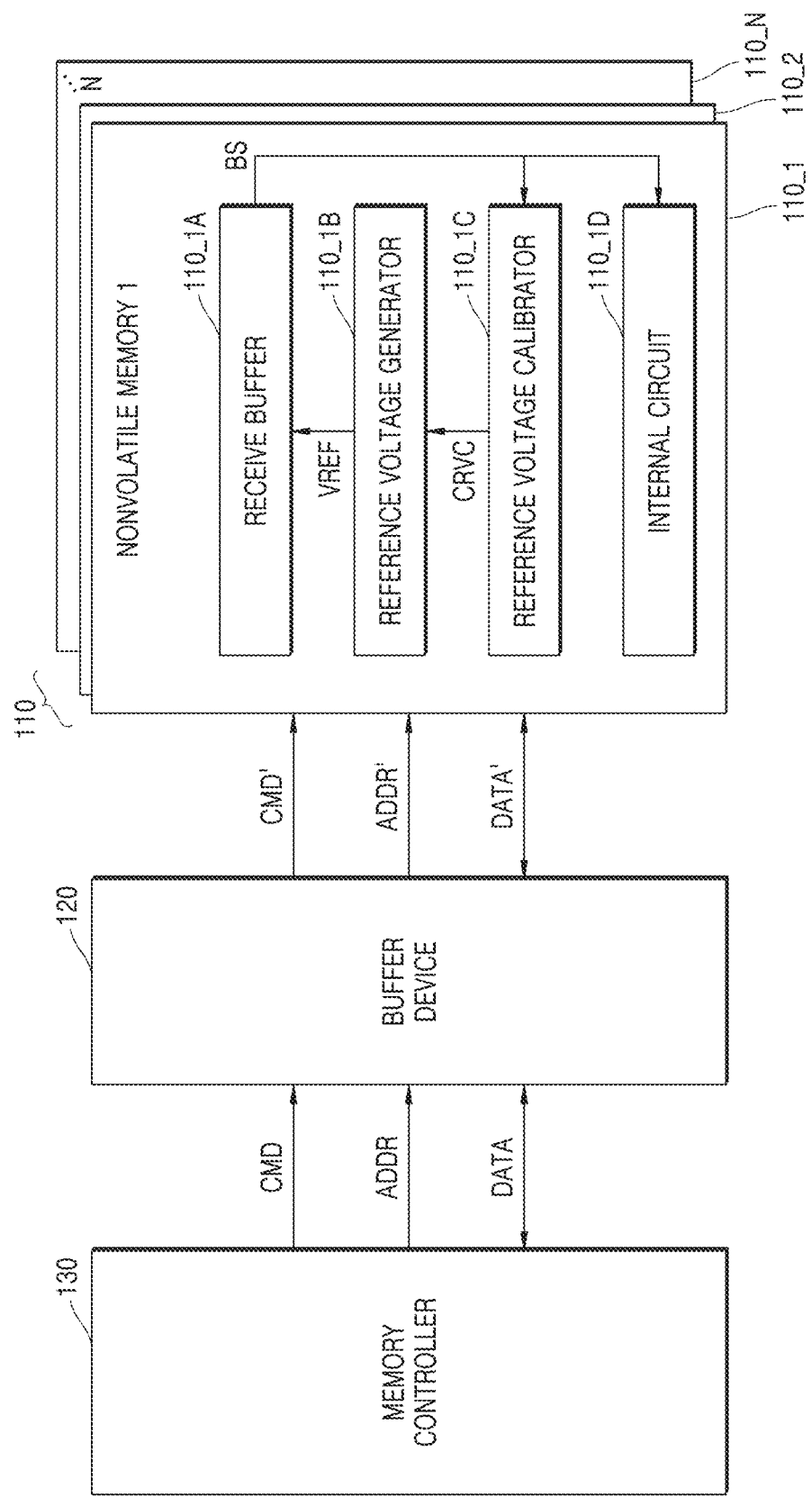
FIG. 1 is a block diagram illustrating a memory system according to some example embodiments.

FIG. 1 is a block diagram illustrating a memory system according to some example embodiments.

Referring to FIG. 1, the memory system may include a memory controller 130, a buffer device (or buffer chip) 120, and a plurality of nonvolatile memories (or nonvolatile memory chips) 110. The buffer device 120 may be connected between the memory controller 130 and the nonvolatile memories 110.

The memory controller 130 may control memory operations for the plurality of nonvolatile memories 110. In detail, the memory controller 130 may transmit signals including an address signal ADDR, a command CMD, and data DATA to the buffer device 120 through channels between the memory controller 130 and the buffer device 120. Herein, a channel between the memory controller 130 and the buffer device 120 may be referred to as a controller channel.

The buffer device 120 may receive and route the address signal ADDR, the command CMD, and/or the data DATA to the nonvolatile memories 110 through channels between the buffer device 120 and the nonvolatile memories 110. Herein, a channel between the buffer device 120 and the nonvolatile memories 110 may be referred to as an internal channel. In some example embodiments, the address signal ADDR may include selection signals (e.g., chip enable signals) for the nonvolatile memories 110, and the buffer device 120 may transmit an address signal ADDR', a command CMD', and/or data DATA' to the nonvolatile memories 110 corresponding to the selection signals.

Each of the nonvolatile memories 110, for example, a first nonvolatile memory 110_1, may include a receive buffer 110_1A, a reference voltage generator 110_1B, a reference voltage calibrator 110_1C, and an internal circuit 110_1D. Hereinafter, an operation of the first nonvolatile memory 110_1 may be described as an example. However, operations of a second nonvolatile memory 110_2 to an Nth nonvolatile memory 110_N may be described with reference to the operation of the first nonvolatile memory 110_1.

The receive buffer 110_1A may generate a buffer signal BS by comparing an input signal received from the buffer device 120 with a reference voltage VREF received from the reference voltage generator 110_1B. The input signal may include the address signal ADDR', the command CMD', and the data DATA'. The receive buffer 110_1A may transmit the buffer signal BS to the internal circuit 110_1D and the reference voltage calibrator 110_1C of the first nonvolatile memory 110_1.

The reference voltage generator 110_1B may generate a reference voltage corresponding to a calibrated reference voltage code signal CRVC received from the reference voltage calibrator 110_1C.

The reference voltage calibrator 110_1C may generate the calibrated reference voltage code signal CRVC based on a reference voltage code signal and the buffer signal BS. Here, the reference voltage code signal may be included in the command CMD'. The reference voltage code signal may refer to a code for generating an initial value of a reference voltage. The reference voltage calibrator 110_1C may measure a duty cycle of the buffer signal BS to generate the calibrated reference voltage code signal CRVC that causes the buffer signal BS to have a reference duty cycle. The duty cycle of the buffer signal BS may vary according to the reference voltage. The reference duty cycle may refer to a duty cycle at which a difference between a high logic level of the buffer signal BS and a low logic level of the buffer signal BS is minimized or reduced. The reference duty cycle may be, for example, 50%.

The internal circuit 110_1D may receive the buffer signal BS from the receive buffer 110_1A and perform an internal circuit operation of each of the nonvolatile memories 110. The internal circuit operation may include read, write, and erase operations of each of the nonvolatile memories 110.

The internal circuit 110_1D may include a memory cell array (not illustrated), and the memory cell array may include a plurality of memory cells arranged in regions in which a plurality of word lines and a plurality of bit lines cross each other.

In some example embodiments, the plurality of memory cells included in each of the nonvolatile memories 110 may include nonvolatile memory cells such as flash memory, resistive random access memory (RAM) (RRAM), phase change RAM (PRAM), or magnetic RAM (MRAM).

The memory controller 130 according to some example embodiments may control a training operation for the buffer device 120. That is, the buffer device 120 may further include a buffer memory (not illustrated) for temporarily storing signals received from the memory controller 130 or buffering, and thus, the training operation for the buffer device 120 may be necessary. The memory controller 130 may perform the training operation for the buffer device 120 to determine characteristics of a controller channel. The training operation for the buffer device 120 may include a write training operation and a read training operation.

When the memory controller 130 performs a write training operation for the buffer device 120, the nonvolatile memories 110 may perform an internal channel reference voltage self-training operation. A detailed description in this aspect is provided below with reference to FIGS. 2 and 3. In addition, when the memory controller 130 performs a read training operation for the buffer device 120, the buffer device 120 may perform an internal channel reference voltage self-training operation. A detailed description in this aspect is provided below with reference to FIGS. 8 and 9.

Figure 8:
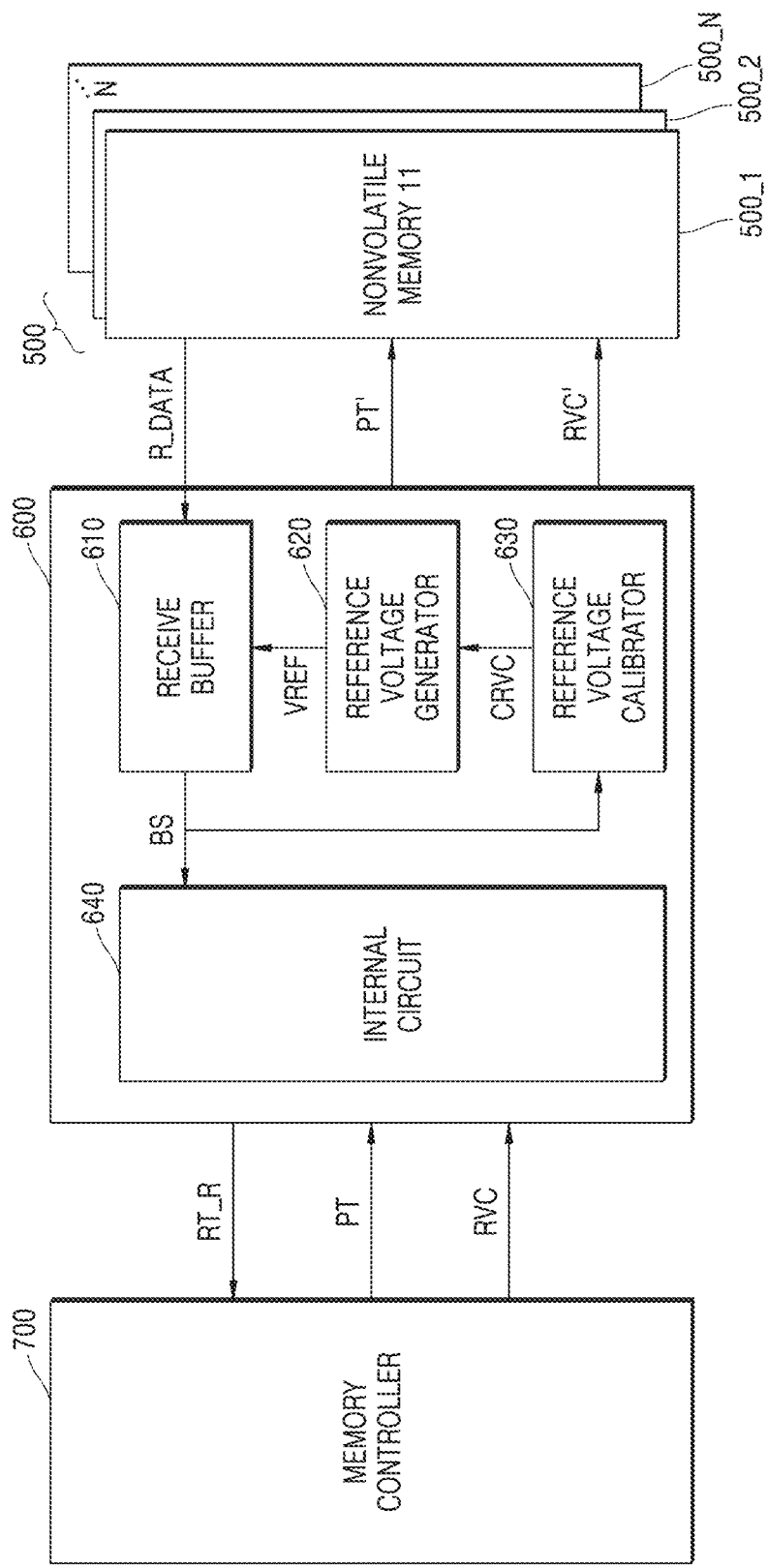
FIG. 8 is a block diagram illustrating a memory system performing an internal channel self-training operation during a read training operation for a buffer device, according to some example embodiments.
Figure 9:
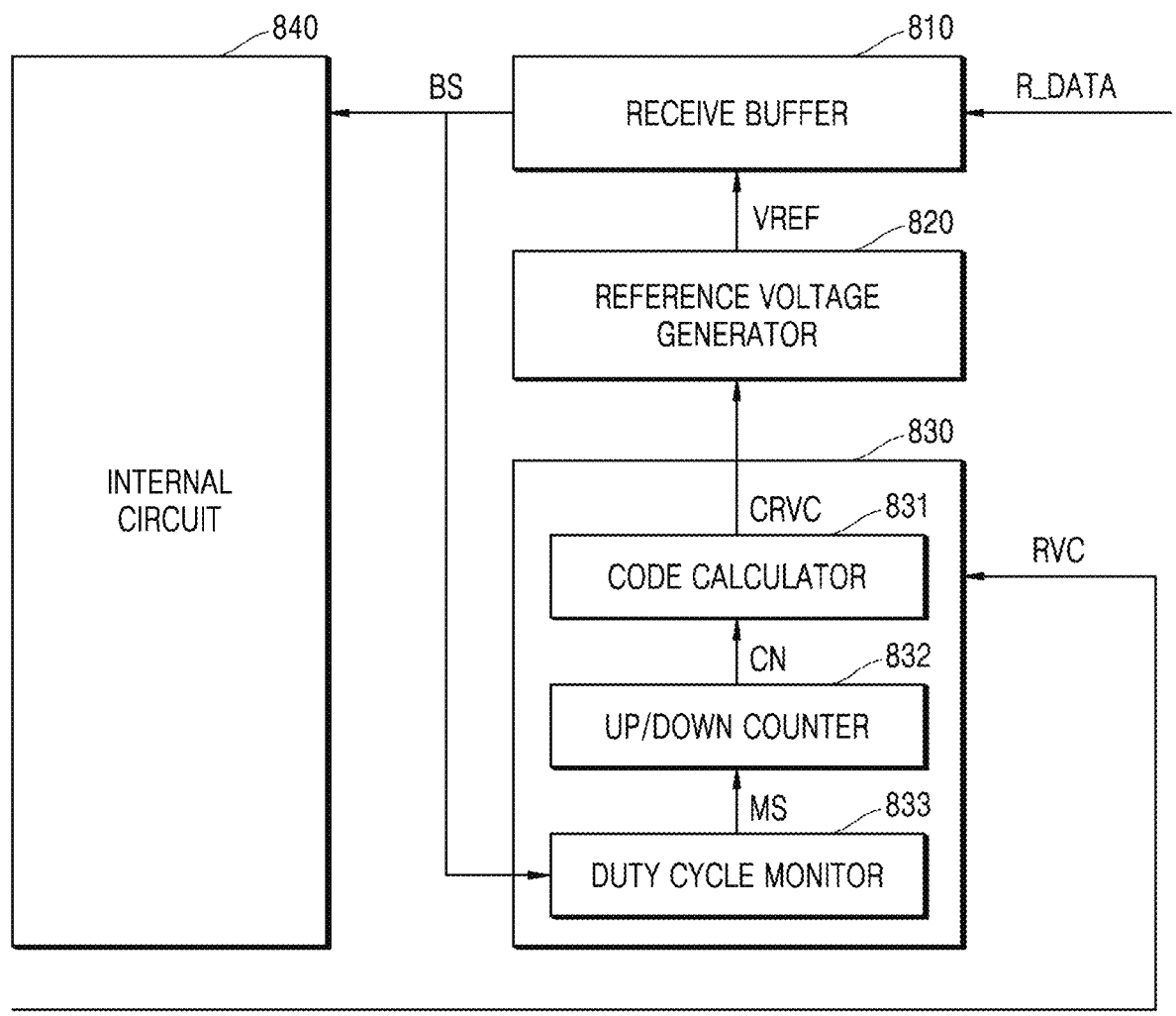
FIG. 9 is a block diagram illustrating a buffer device according to some example embodiments.

In FIG. 1, each of the nonvolatile memories 110, for example, the first nonvolatile memory 110_1 includes the receive buffer 110_1A, the reference voltage generator 110_1B, the reference voltage calibrator 110_1C, and the internal circuit 110_1D for performing an internal channel reference voltage self-training operation. However, example embodiments are not limited thereto. Referring to FIGS. 8 and 9, the buffer device 120 may also include a receive buffer, a reference voltage generator, a reference voltage calibrator, and an internal circuit for performing an internal channel reference voltage self-training operation.

As described above, the memory system according to the inventive concepts may perform an internal channel reference voltage self-training operation when performing a training operation for the buffer device 120, thereby reducing the time required for the entire training operation including a controller channel training operation and an internal channel training operation. Therefore, the improved devices and methods overcome the deficiencies of the conventional devices and methods to training operation including a controller channel training operation and an internal channel training operation and memory operations while reducing resource consumption and increasing operating efficiency/parameters. For example, by using the disclosed training and methods, the buffer device 120 may require fewer resources, such as processing resources, memory access and/or power to drive circuitry to operate the buffer device and memory system.

Figure 2:
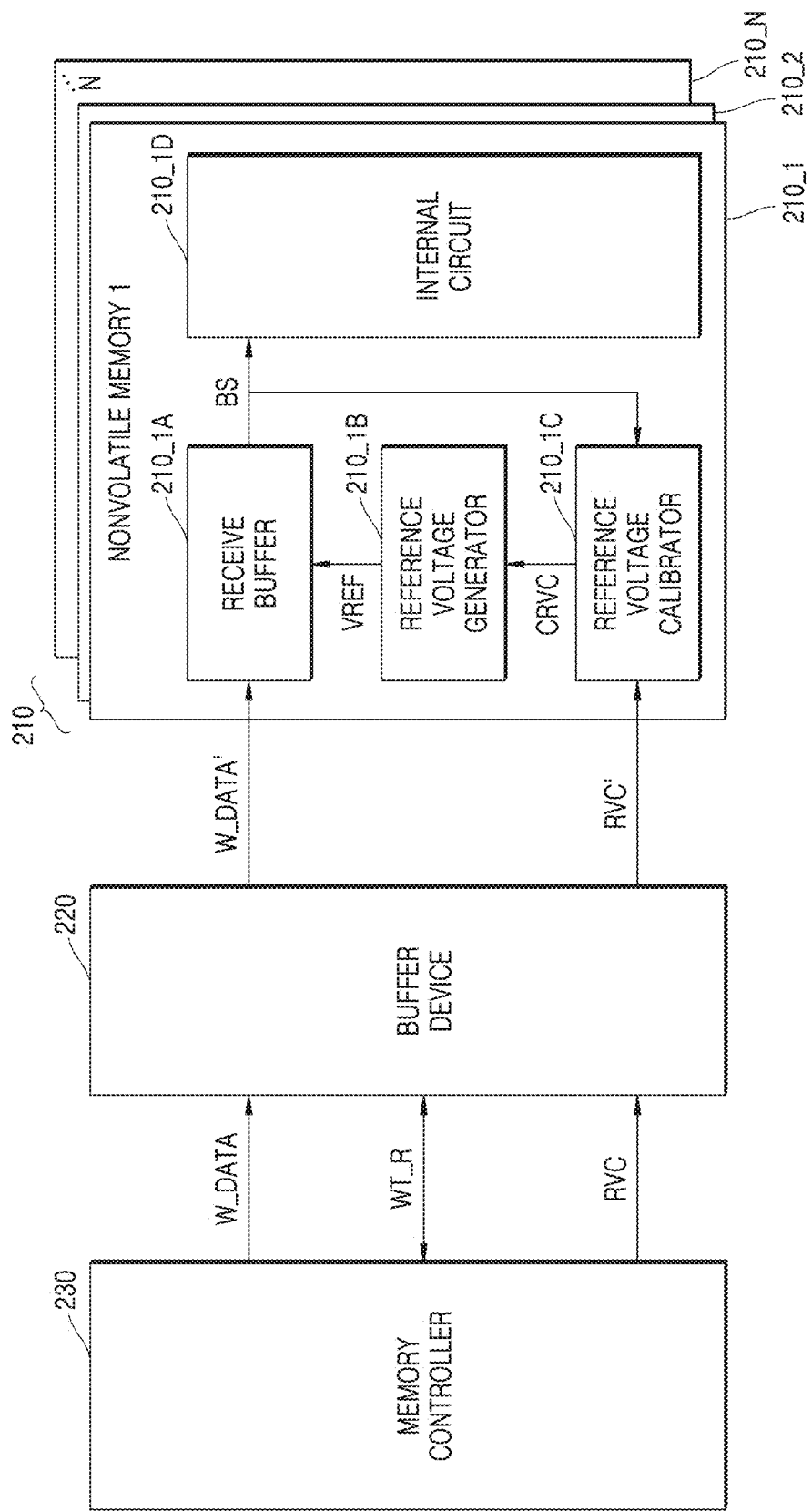
FIG. 2 is a block diagram illustrating a memory system performing an internal channel self-training operation during a write training operation for a buffer device, according to some example embodiments.

FIG. 2 is a block diagram illustrating a memory system performing an internal channel self-training operation during a write training operation for a buffer device, according to some example embodiments.

Referring to FIG. 2, the memory system may include nonvolatile memories 210, a buffer device 220, and a memory controller 230. As described above, each of the nonvolatile memories 210, for example, a first nonvolatile memory 2101 may include a receive buffer 210_1A, a reference voltage generator 210_1B, a reference voltage calibrator 210_1C, and an internal circuit 210_1D.

The memory controller 230 may generate and transmit write data W_DATA to the buffer device 220 during a write training operation. The write data W_DATA may have a high logic level or a low logic level. For example, the write data W_DATA may be a signal toggling between a high logic level and a low logic level. In addition, the memory controller 230 may transmit a reference voltage code signal RVC to the buffer device 220. The buffer device 220 may determine a logic level of the write data W_DATA based on a reference voltage generated using the reference voltage code signal RVC. The buffer device 220 may transmit, to the memory controller 230, a write training response WT_R generated by sampling the write data W_DATA. The memory controller 230 may determine characteristics of a controller channel based on the write training response WT_R.

The buffer device 220 may route the write data W_DATA and the reference voltage code signal RVC received from the memory controller 230 during the write training operation and transmit the write data W_DATA and the reference voltage code signal RVC to the nonvolatile memories 210.

The receive buffer 210_1A may receive write data W_DATA' from the buffer device 220 and receive a reference voltage VREF from the reference voltage generator 210_1B. The receive buffer 210_1A may generate a buffer signal BS by comparing the write data W_DATA' with the reference voltage VREF. In detail, when a voltage of the write data W_DATA' is greater than or equal to the reference voltage VREF, the receive buffer 210_1A may generate the buffer signal BS having a high logic level, and when the voltage of the write data W_DATA' is less than the reference voltage VREF, the receive buffer 210_1A may generate the buffer signal BS having a low logic level.

The reference voltage calibrator 210_1C may receive a reference voltage code signal RVC' from the buffer device 220 and receive the buffer signal BS from the receive buffer 210_1A. The reference voltage calibrator 210_1C may measure a duty cycle of the buffer signal BS and compare the duty cycle with a reference duty cycle. The reference duty cycle may be a value preset (or, alternatively, desired, generated, or determined) by the memory controller 230. For example, when the duty cycle of the buffer signal BS is 60% and the reference duty cycle is 50%, the reference voltage calibrator 210_1C may determine that the duty cycle of the buffer signal BS is greater than the reference duty cycle. Accordingly, the reference voltage calibrator 210_1C may generate a calibrated reference voltage code signal CRVC by calibrating the reference voltage code signal RVC' such that the difference between the duty cycle of the buffer signal BS and the reference duty cycle is reduced.

The reference voltage VREF may vary according to a channel between the buffer device 220 and each of the nonvolatile memories 210, that is, an internal channel. In addition, the reference voltage calibrator 210_1C may not receive a separate command to calibrate the reference voltage code signal RVC', but rather use the reference voltage code signal RVC' used for write training of the buffer device 220 and the buffer signal BS received from the receive buffer 210_1A, and thus, the reference voltage calibrator 210_1C may calibrate the reference voltage code signal RVC' by itself. Accordingly, an operation of calibrating, by the reference voltage calibrator 210_1C, the reference voltage code signal RVC' may be referred to as an internal channel reference voltage self-training operation. A detailed operation of the reference voltage calibrator 210_1C is described below with reference to FIG. 3.

The reference voltage generator 210_1B may generate the reference voltage VREF corresponding to the calibrated reference voltage code signal CRVC and provide the reference voltage VREF to the receive buffer 210_1A.

The receive buffer 210_1A may generate the buffer signal BS by comparing the reference voltage VREF corresponding to the calibrated reference voltage code signal CRVC with the write data W_DATA'. The receive buffer 210_1A may generate the buffer signal BS having a reduced duty cycle difference from the reference duty cycle, compared to the duty cycle difference before the calibration of the reference voltage code signal RVC'.

The internal circuit 210_1D may operate based on the buffer signal BS received from the receive buffer 210_1A. For example, the internal circuit 210_1D may perform write, read, and/or erase operations based on the buffer signal BS.

As described above, each of the nonvolatile memories 210 may perform an internal channel reference voltage self-training operation during a write training operation for the buffer device 220, thereby reducing the time required for the entire training operation.

Figure 3:
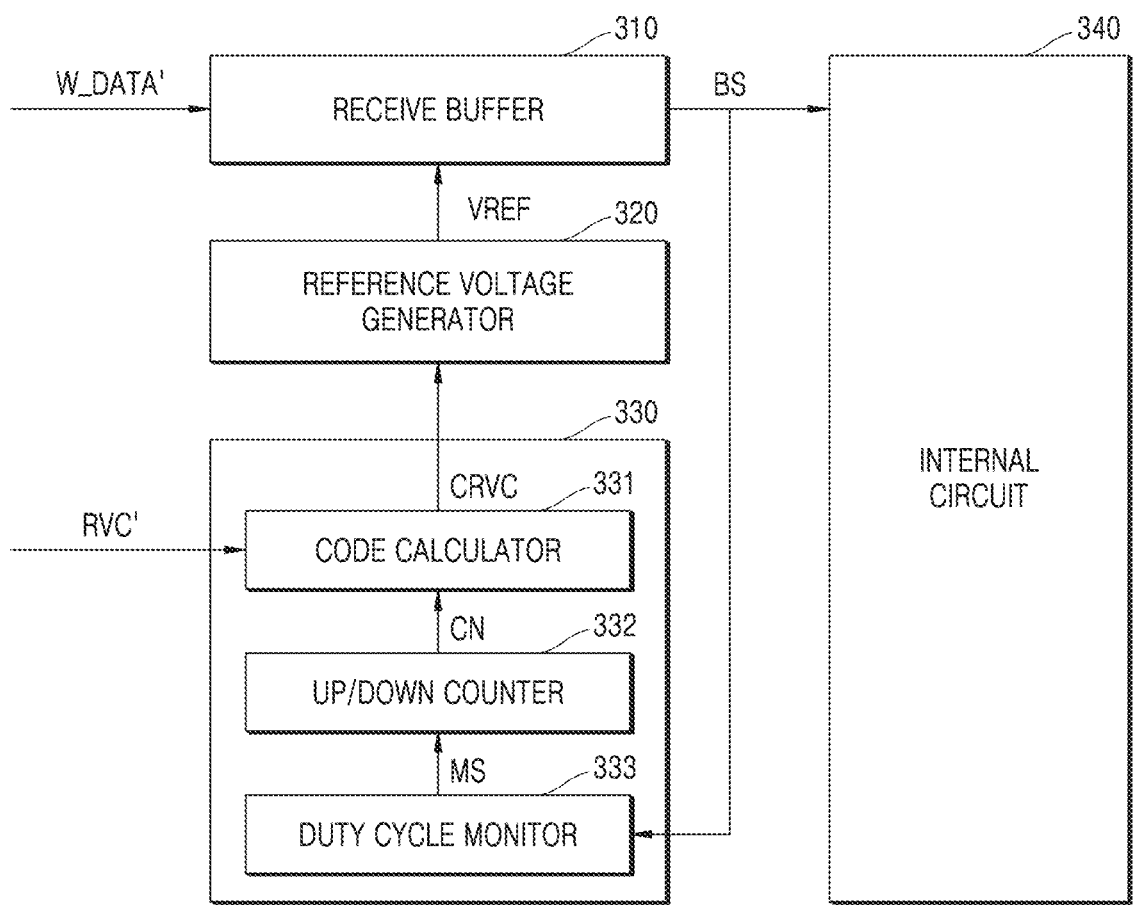
FIG. 3 is a block diagram illustrating a nonvolatile memory according to some example embodiments.

FIG. 3 is a block diagram illustrating a nonvolatile memory according to some example embodiments. The nonvolatile memory illustrated in FIG. 3 may refer to, for example, any nonvolatile memory among the nonvolatile memories 210 of FIG. 2. FIG. 3 may be described with reference to FIG. 2.

Referring to FIG. 3, the nonvolatile memory may include a receive buffer 310, a reference voltage generator 320, a reference voltage calibrator 330, and an internal circuit 340.

The receive buffer 310 may receive the write data W_DATA' from the buffer device 220 and receive a reference voltage VREF from the reference voltage generator 320. The receive buffer 310 may generate a buffer signal BS by comparing the write data W_DATA' with the reference voltage VREF. As described above, when a voltage of the write data W_DATA' is greater than or equal to the reference voltage VREF, the receive buffer 310 may generate the buffer signal BS having a high logic level, and when the voltage of the write data W_DATA' is less than the reference voltage VREF, the receive buffer 310 may generate the buffer signal BS having a low logic level.

The reference voltage calibrator 330 may include a duty cycle monitor 333, an up/down counter 332, and a code calculator 331 and generate a calibrated reference voltage code signal CRVC based on the reference voltage code signal RVC' and the buffer signal BS.

The duty cycle monitor 333 may generate a monitoring signal MS by measuring a duty cycle of the buffer signal BS. The duty cycle monitor 333 may transmit, to the up/down counter 332, the monitoring signal MS including a measurement duty cycle that is a value obtained by measuring the duty cycle of the buffer signal BS. For example, the measurement duty cycle of the buffer signal BS measured by the duty cycle monitor 333 may be 60%.

The up/down counter 332 may generate a count number signal CN by comparing a reference duty cycle with the measurement duty cycle. In detail, the up/down counter 332 may determine the measurement duty cycle of the buffer signal BS through the monitoring signal MS. In addition, the reference duty cycle may be a value included in command CMD' received by the nonvolatile memory from the buffer device 220. For example, the reference duty cycle may be 50%. When the measurement duty cycle is greater than or equal to the reference duty cycle, the up/down counter 332 may generate an up count number signal, and when the measurement duty cycle is less than the reference duty cycle, the up/down counter 332 may generate a down count number signal. Herein, signals generated by the up/down counter 332, including the up count number signal and the down count number signal, may be collectively referred to as the count number signal CN. Herein, the up count number signal may correspond to 1, and the down count number signal may correspond to 0. In other words, the up/down counter 332 may output a signal corresponding to 0 or 1. However, this is only an example, and the up count number signal may correspond to 0 and the down count number signal may correspond to 1.

The code calculator 331 may generate the calibrated reference voltage code signal CRVC based on the count number signal CN and the reference voltage code signal RVC'. In detail, the code calculator 331 may calculate a voltage corresponding to the count number signal CN with respect to a reference voltage corresponding to the reference voltage code signal RVC' and generate a code corresponding to a result of the calculation as the calibrated reference voltage code signal CRVC. To generate the code as the calibrated reference voltage code signal CRVC, the code calculator 331 may generate an up/down accumulation signal U/DS, as described with reference to in FIG. 5. The up/down accumulation signal U/DS may refer to a signal obtained by accumulating voltages corresponding to the count number signal CN. The code calculator 331 may receive the reference voltage code signal RVC' from the buffer device 220. The reference voltage code signal RVC' may refer to a code for generating an initial value of a reference voltage. For example, when the initial value of the reference voltage is 1 V, the reference voltage code signal RVC' may include a code for the reference voltage generator 320 to generate a reference voltage of 1 V.

When the code calculator 331 receives the up count number signal from the up/down counter 332, the code calculator 331 may generate the calibrated reference voltage code signal CRVC so that the reference voltage generator 320 generates a higher reference voltage. For example, when the code calculator 331 receives the up count number signal, the code calculator 331 may generate the calibrated reference voltage code signal CRVC so that the reference voltage generator 320 generates a reference voltage of 1.1 V.

In contrast, when the code calculator 331 receives the down count number signal from the up/down counter 332, the code calculator 331 may generate the calibrated reference voltage code signal CRVC so that the reference voltage generator 320 generates a lower reference voltage. For example, when the code calculator 331 receives the down count number signal, the code calculator 331 may generate the calibrated reference voltage code signal CRVC so that the reference voltage generator 320 generates a reference voltage of 0.9 V. Herein, for example, a reference voltage is calibrated in units of 0.1 V. However, this is only an example, and the unit of a reference voltage adjusted according to the count number signal CN may be set differently according to some example embodiments, and the initial value of the reference voltage may also be set differently according to some example embodiments.

The reference voltage generator 320 may generate a voltage corresponding to the calibrated reference voltage code signal CRVC and provide a calibrated reference voltage to the receive buffer 310.

The receive buffer 310 may generate the buffer signal BS by comparing the reference voltage VREF corresponding to the calibrated reference voltage code signal CRVC with the write data W_DATA'. The receive buffer 310 may generate the buffer signal BS having a reduced duty cycle difference from the reference duty cycle, as compared to before the calibration of the reference voltage code signal RVC'. Because the reference voltage calibrator 330 repeatedly generates the calibrated reference voltage code signal CRVC based on the reference voltage code signal RVC' and the buffer signal BS, the difference between the reference duty cycle and the measurement duty cycle of the buffer signal BS may be gradually reduced and/or maintained at a reduced level during operations.

The internal circuit 340 may operate based on the buffer signal BS received from the receive buffer 310. For example, the internal circuit 340 may perform write, read, and erase operations based on the buffer signal BS.

Figure 4A:
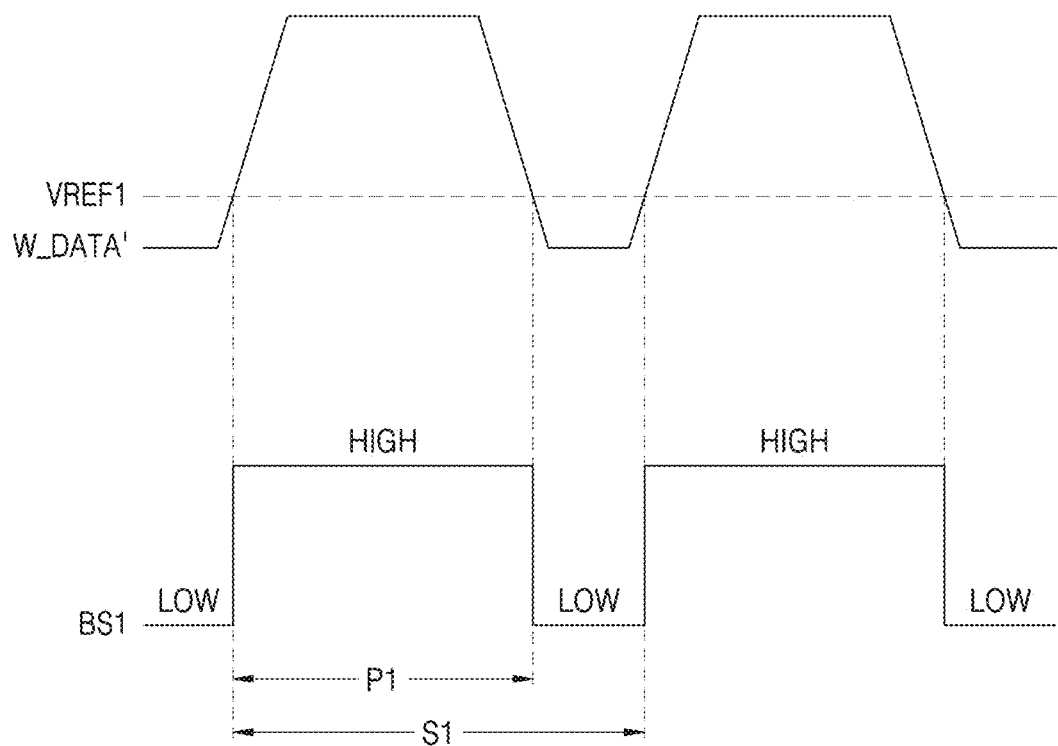
FIGS. 4A and 4B are timing diagrams illustrating an operation of a receive buffer according to some example embodiments.
Figure 4B:
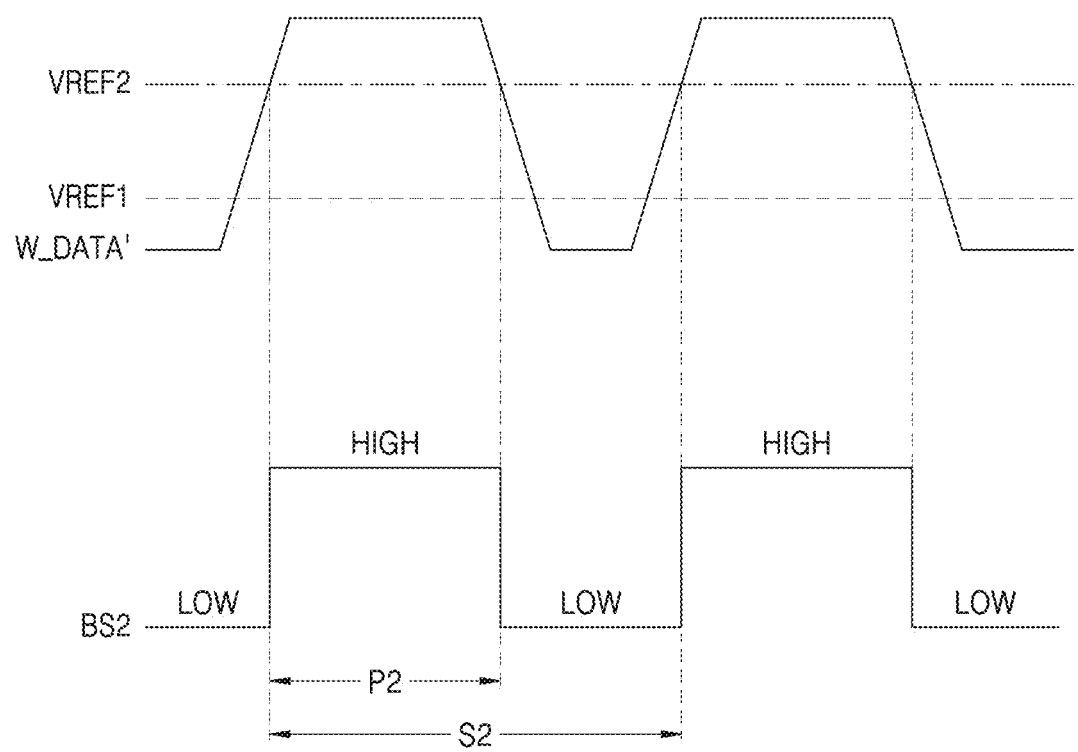

FIGS. 4A and 4B are timing diagrams illustrating an operation of a receive buffer according to some example embodiments. FIGS. 4A and 4B may be described with reference to FIGS. 1 to 3. In detail, FIG. 4A may illustrate a situation before the reference voltage code signal RVC' is calibrated by the reference voltage calibrator 330, and FIG. 4B may illustrate a situation after the reference voltage code signal RVC' is calibrated.

Referring to FIG. 4A, the receive buffer 310 may generate a buffer signal BS1 by comparing the write data W_DATA' received from the buffer device 220 with a reference voltage VREF1. When a voltage of the write data W_DATA' is greater than or equal to the reference voltage VREF1, the receive buffer 310 may generate the buffer signal BS1 having a high logic level, and when the voltage of the write data W_DATA' is less than the reference voltage VREF1, the receive buffer 310 may generate the buffer signal BS1 having a low logic level. A duty cycle of the buffer signal BS1 may refer to a ratio of the high logic level in a period of the write data W_DATA' in which the high logic level and the low logic level are periodically repeated. For example, referring to FIG. 4A, the duty cycle of the buffer signal BS1 may be P1/S1×100%.

Referring to FIG. 4B, when the reference voltage code signal RVC' is calibrated by the reference voltage calibrator 330, a reference voltage VREF2 may be higher than the reference voltage VREF1 of FIG. 4A. However, this is only an example, and according to some example embodiments, after the reference voltage code signal RVC' is calibrated by the reference voltage calibrator 330, the reference voltage VREF2 may be lower than before the calibration. Referring to FIG. 4B, a duty cycle of a buffer signal BS2 may be P2/S2×100%. A difference between a duty cycle and a reference duty cycle after calibration may be smaller than a difference between the duty cycle and the reference duty cycle before the calibration. Here, the reference duty cycle may be, for example, 50%.

Figure 5:
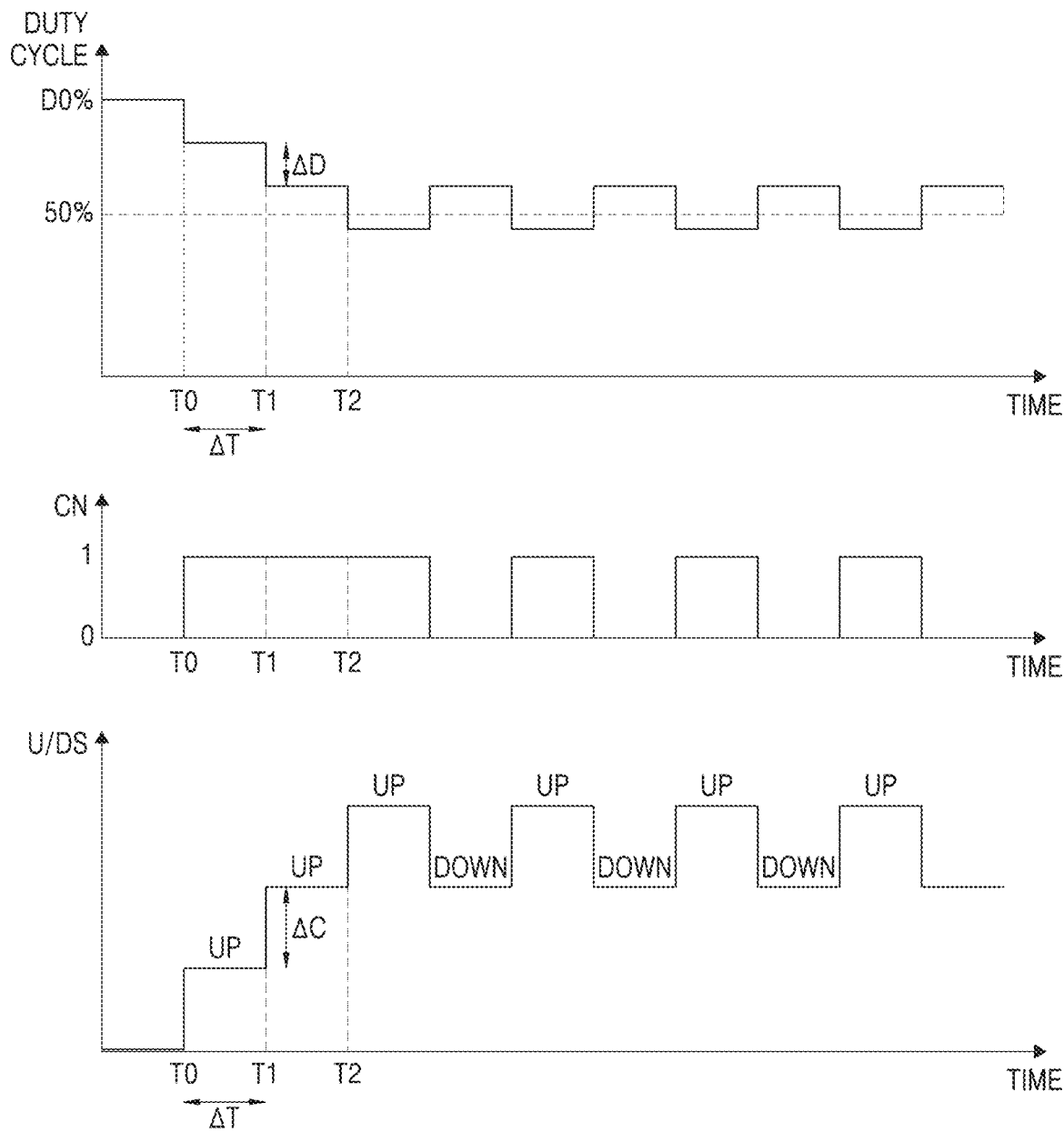
FIG. 5 is a timing diagram illustrating an operation of an up/down counter according to some example embodiments.

FIG. 5 is a timing diagram illustrating an operation of an up/down counter according to some example embodiments. FIG. 5 may be described with reference to FIGS. 1 to 3.

Referring to FIG. 5, the duty cycle of the buffer signal BS, the count number signal CN, and the up/down accumulation signal U/DS are illustrated according to time.

The duty cycle of the buffer signal BS may initially be D0 %, and the reference duty cycle may be 50%. The up/down counter 332 may output the count number signal CN from a time point T0. According to the count number signal CN, the difference between the duty cycle of the buffer signal BS and the reference duty cycle may be reduced until a time point T2, and the duty cycle of the buffer signal BS may be toggled after the time point T2. The duty cycle of the buffer signal BS and the count number signal CN may vary at intervals of ΔT. Here, ΔT may be a period of a clock driving the up/down counter 332. The reference voltage VREF may vary according to the count number signal CN, and thus, the duty cycle of the buffer signal BS may vary at intervals of ΔD.

When the duty cycle of the buffer signal BS is greater than or equal to the reference duty cycle, the up/down counter 332 may generate an up count number signal, and when the duty cycle of the buffer signal BS is less than the reference duty cycle, the up/down counter 332 may generate a down count number signal. Here, the up count number signal may refer to a signal corresponding to 1, and the down count number signal may refer to a signal corresponding to 0.

The up/down accumulation signal U/DS may refer to an internal signal of the code calculator 331 receiving the count number signal CN from the up/down counter 332. The up/down accumulation signal U/DS may refer to a signal obtained by accumulating voltages corresponding to the up count number signal or the down count number signal to generate the calibrated reference voltage code signal CRVC. For example, when the code calculator 331 receives the up count number signal, that is, a signal corresponding to 1, from the up/down counter 332, the code calculator 331 may generate the up/down accumulation signal U/DS having a higher voltage by ΔC than the previous voltage. In contrast, when the code calculator 331 receives the down count number signal, that is, a signal corresponding to 0, from the up/down counter 332, the code calculator 331 may generate the up/down accumulation signal U/DS having a lower voltage by ΔC than the previous voltage.

Figure 6:
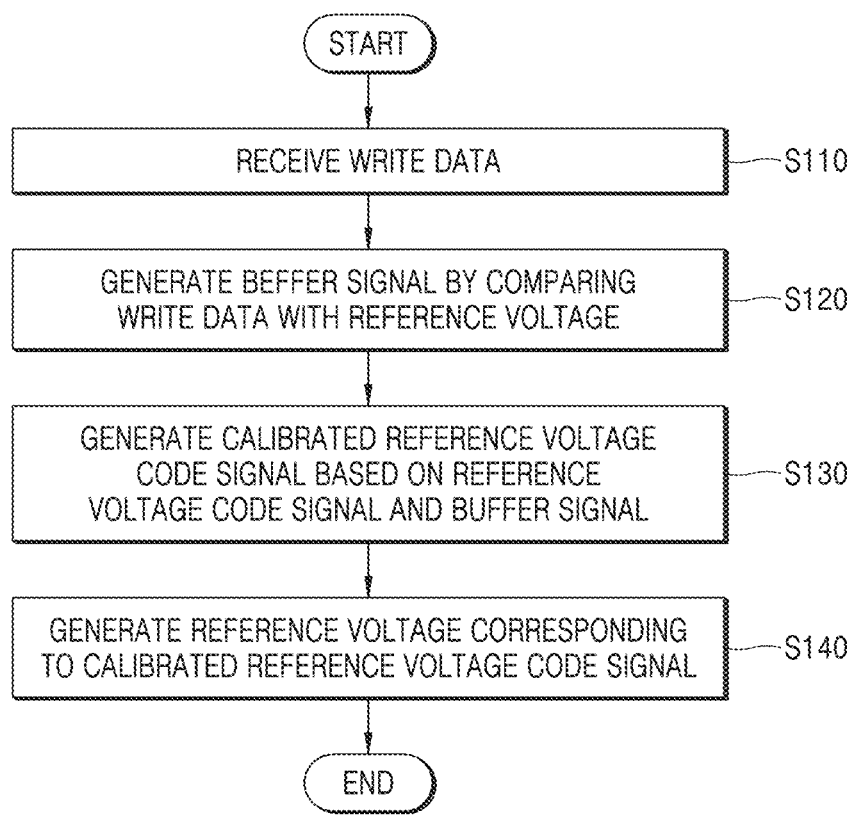
FIG. 6 is a flowchart illustrating an operation of a nonvolatile memory according to some example embodiments.

FIG. 6 is a flowchart illustrating an operation of a nonvolatile memory according to some example embodiments.

Referring to FIG. 6, an operating method of the nonvolatile memory may include operations S110 to S140. FIG. 6 may be described with reference to FIGS. 1 to 3.

In operation S110, the nonvolatile memory may receive the write data W_DATA'. For example, the nonvolatile memory may receive, through the buffer device 220, the write data W_DATA' generated by the memory controller 230 during a write training operation for the buffer device 220.

In operation S120, the nonvolatile memory may generate the buffer signal BS by comparing the write data W_DATA' with the reference voltage VREF. For example, when a voltage of the write data W_DATA' is greater than or equal to the reference voltage VREF, the receive buffer 310 of the nonvolatile memory may generate the buffer signal BS having a high logic level, and when the voltage of the write data W_DATA' is less than the reference voltage VREF, the receive buffer 310 may generate the buffer signal BS having a low logic level.

In operation S130, the nonvolatile memory may generate the calibrated reference voltage code signal CRVC based on the reference voltage code signal RVC' and the buffer signal BS. For example, the reference voltage calibrator 330 of the nonvolatile memory may generate the calibrated reference voltage code signal CRVC so that a difference between a duty cycle of the buffer signal BS and a reference duty cycle is reduced.

In operation S140, the nonvolatile memory may generate the reference voltage VREF corresponding to the calibrated reference voltage code signal CRVC. For example, the reference voltage generator 320 of the nonvolatile memory may generate a reference voltage corresponding to the calibrated reference voltage code signal CRVC generated in operation S130.

Figure 7:
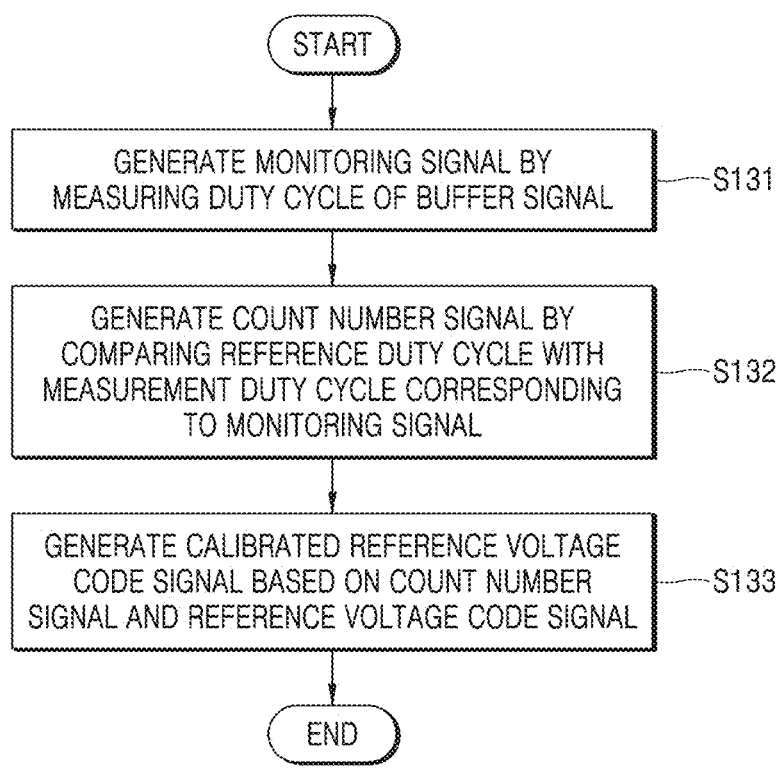
FIG. 7 is a flowchart illustrating an operation of a nonvolatile memory according to some example embodiments.

FIG. 7 is a flowchart illustrating an operation of a nonvolatile memory according to some example embodiments. FIG. 7 may correspond to, for example, operation S130 of FIG. 6.

In operation S131, the nonvolatile memory may generate the monitoring signal MS by measuring the duty cycle of the buffer signal BS. For example, the duty cycle monitor 333 of the nonvolatile memory may generate the monitoring signal MS including a measurement duty cycle that is a value obtained by measuring the duty cycle of the buffer signal BS.

In operation S132, the nonvolatile memory may generate the count number signal CN by comparing a reference duty cycle with the measurement duty cycle corresponding to the monitoring signal MS. For example, when the measurement duty cycle is greater than or equal to the reference duty cycle, the up/down counter 332 of the nonvolatile memory may generate an up count number signal, and when the measurement duty cycle is less than the reference duty cycle, the up/down counter 332 may generate a down count number signal.

In operation S133, the nonvolatile memory may generate the calibrated reference voltage code signal CRVC based on the count number signal CN and the reference voltage code signal RVC'. In some example embodiments, the code calculator 331 of the nonvolatile memory may calculate a voltage corresponding to the count number signal CN with respect to a voltage corresponding to the reference voltage code signal RVC'. In addition, the code calculator 331 of the nonvolatile memory may generate a code corresponding to a result of the calculation as the calibrated reference voltage code signal CRVC.

FIG. 8 is a block diagram illustrating a memory system performing an internal channel self-training operation during a read training operation for a buffer device, according to some example embodiments.

Referring to FIG. 8, the memory system may include nonvolatile memories 500, a buffer device 600, and a memory controller 700. The nonvolatile memories 500, the buffer device 600, and the memory controller 700 may store the same read training data in advance for a read training operation. When the nonvolatile memories 500 receive a pattern signal PT' of a specific pattern, the nonvolatile memories 500 may transmit read data R_DATA including read training data to the buffer device 600, in response to the pattern signal PT'.

For example, the memory controller 700 may generate and transmit a pattern signal PT to the buffer device 600 during a read training operation for the buffer device 600. When the buffer device 600 receives the pattern signal PT, the buffer device 600 may transmit, to the memory controller 700, a read training response RT_R including read training data stored in the buffer device 600. The memory controller 700 may determine characteristics of a controller channel based on the read training response RT_R.

The buffer device 600 may route the pattern signal PT and a reference voltage code signal RVC received from the memory controller 700 during the read training operation and transmit the pattern signal PT and the reference voltage code signal RVC to the nonvolatile memories 500.

In response to the pattern signal PT received from the buffer device 600, each of the nonvolatile memories 500 may transmit, to the buffer device 600, the read data R_DATA including read training data embedded in each of the nonvolatile memories 500.

The buffer device 600 may include a receive buffer 610, a reference voltage generator 620, a reference voltage calibrator 630, and an internal circuit 640.

The receive buffer 610 may receive the read data R_DATA from each of the nonvolatile memories 500 and receive a reference voltage VREF from the reference voltage generator 620. The receive buffer 610 may generate a buffer signal BS by comparing the read data R_DATA with the reference voltage VREF. In detail, when a voltage of the read data R_DATA is greater than or equal to the reference voltage VREF, the receive buffer 610 may generate the buffer signal BS having a high logic level, and when the voltage of the read data R_DATA is less than the reference voltage VREF, the receive buffer 610 may generate the buffer signal BS having a low logic level.

The reference voltage calibrator 630 may receive the reference voltage code signal RVC from the memory controller 700 and receive the buffer signal BS from the receive buffer 610. The reference voltage calibrator 630 may measure a duty cycle of the buffer signal BS and compare the duty cycle with a reference duty cycle. For example, when the duty cycle of the buffer signal BS is 60% and the reference duty cycle is 50%, the reference voltage calibrator 630 may determine that the duty cycle of the buffer signal BS is greater than the reference duty cycle. Accordingly, the reference voltage calibrator 630 may generate a calibrated reference voltage code signal CRVC by calibrating the reference voltage code signal RVC such that the difference between the duty cycle of the buffer signal BS and the reference duty cycle is reduced.

The reference voltage VREF may vary according to a channel between the buffer device 600 and each of the nonvolatile memories 500, that is, an internal channel. In addition, the reference voltage calibrator 630 may not receive a separate command to calibrate the reference voltage code signal RVC, but rather use the reference voltage code signal RVC used for read training of the buffer device 600 and the buffer signal BS received from the receive buffer 610, to calibrate the reference voltage code signal RVC. Accordingly, an operation of calibrating, by the reference voltage calibrator 630, the reference voltage code signal RVC may be referred to as an internal channel reference voltage self-training operation. A detailed operation of the reference voltage calibrator 630 is described below with reference to FIG. 9.

The reference voltage generator 620 may generate the reference voltage VREF corresponding to the calibrated reference voltage code signal CRVC and provide the reference voltage VREF to the receive buffer 610.

The receive buffer 610 may generate the buffer signal BS by comparing the reference voltage VREF corresponding to the calibrated reference voltage code signal CRVC with the read data R_DATA. The receive buffer 610 may generate the buffer signal BS having a reduced duty cycle difference from the reference duty cycle, as compared to before the calibration of the reference voltage code signal RVC.

The internal circuit 640 may operate based on the buffer signal BS received from the receive buffer 610.

As described above, the buffer device 600 may sequentially perform reference voltage self-training operations for N internal channels. The buffer device 600 may perform an internal channel reference voltage self-training operation during a read training operation for the buffer device 600, thereby reducing the time required for the entire training operation.

FIG. 9 is a block diagram illustrating a buffer device according to some example embodiments. The buffer device illustrated in FIG. 9 may refer to, for example, the buffer device 600 of FIG. 8. FIG. 9 may be described with reference to FIG. 8.

Referring to FIG. 9, the buffer device may include a receive buffer 810, a reference voltage generator 820, a reference voltage calibrator 830, and an internal circuit 840.

The receive buffer 810 may receive the read data R_DATA from each of the nonvolatile memories 500 and receive a reference voltage VREF from the reference voltage generator 820. The receive buffer 810 may generate a buffer signal BS by comparing the read data R_DATA with the reference voltage VREF. As described above, when the voltage of the read data R_DATA is greater than or equal to the reference voltage VREF, the receive buffer 810 may generate the buffer signal BS having a high logic level, and when the voltage of the read data R_DATA is less than the reference voltage VREF, the receive buffer 810 may generate the buffer signal BS having a low logic level.

The reference voltage calibrator 830 may include a duty cycle monitor 833, an up/down counter 832, and a code calculator 831 and generate a calibrated reference voltage code signal CRVC based on the reference voltage code signal RVC and the buffer signal BS.

The duty cycle monitor 833 may generate a monitoring signal MS by measuring a duty cycle of the buffer signal BS. The duty cycle monitor 833 may transmit, to the up/down counter 832, the monitoring signal MS including a measurement duty cycle that is a value obtained by measuring the duty cycle of the buffer signal BS. For example, the measurement duty cycle of the buffer signal BS measured by the duty cycle monitor 833 may be 60%.

The up/down counter 832 may generate a count number signal CN by comparing a reference duty cycle with the measurement duty cycle. In detail, the up/down counter 832 may determine the measurement duty cycle of the buffer signal BS through the monitoring signal MS. In addition, the reference duty cycle may be a value embedded the buffer device for a read training operation. For example, the reference duty cycle may be 50%. When the measurement duty cycle is greater than or equal to the reference duty cycle, the up/down counter 832 may generate an up count number signal, and when the measurement duty cycle is less than the reference duty cycle, the up/down counter 832 may generate a down count number signal.

The code calculator 831 may generate the calibrated reference voltage code signal CRVC based on the count number signal CN and the reference voltage code signal RVC. In detail, the code calculator 831 may calculate a voltage corresponding to the count number signal CN with respect to a reference voltage corresponding to the reference voltage code signal RVC and generate a code corresponding to a result of the calculation as the calibrated reference voltage code signal CRVC. The code calculator 831 may receive the reference voltage code signal RVC from the memory controller 700. The reference voltage code signal RVC may refer to a code for generating an initial value of a reference voltage. For example, when the initial value of the reference voltage is 1 V, the reference voltage code signal RVC may include a code for the reference voltage generator 820 to generate a reference voltage of 1 V.

When the code calculator 831 receives the up count number signal from the up/down counter 832, the code calculator 831 may generate the calibrated reference voltage code signal CRVC so that the reference voltage generator 820 generates a higher reference voltage. For example, when the code calculator 831 receives the up count number signal, the code calculator 831 may generate the calibrated reference voltage code signal CRVC so that the reference voltage generator 820 generates a reference voltage of 1.1 V.

In contrast, when the code calculator 831 receives the down count number signal from the up/down counter 832, the code calculator 831 may generate the calibrated reference voltage code signal CRVC so that the reference voltage generator 820 generates a lower reference voltage. For example, when the code calculator 831 receives the down count number signal, the code calculator 831 may generate the calibrated reference voltage code signal CRVC so that the reference voltage generator 820 generates a reference voltage of 0.9 V.

The reference voltage generator 820 may generate a voltage corresponding to the calibrated reference voltage code signal CRVC and provide a calibrated reference voltage to the receive buffer 810.

The receive buffer 810 may generate the buffer signal BS by comparing the reference voltage corresponding to the calibrated reference voltage code signal CRVC with the read data R_DATA. The receive buffer 810 may generate the buffer signal BS having a reduced duty cycle difference from the reference duty cycle, as compared to before the calibration of the reference voltage code signal RVC. Because the reference voltage calibrator 830 repeatedly generates the calibrated reference voltage code signal CRVC based on the reference voltage code signal RVC and the buffer signal BS, the difference between the reference duty cycle and the measurement duty cycle of the buffer signal BS may be gradually reduced.

The internal circuit 840 may operate based on the buffer signal BS received from the receive buffer 810.

Figure 10:
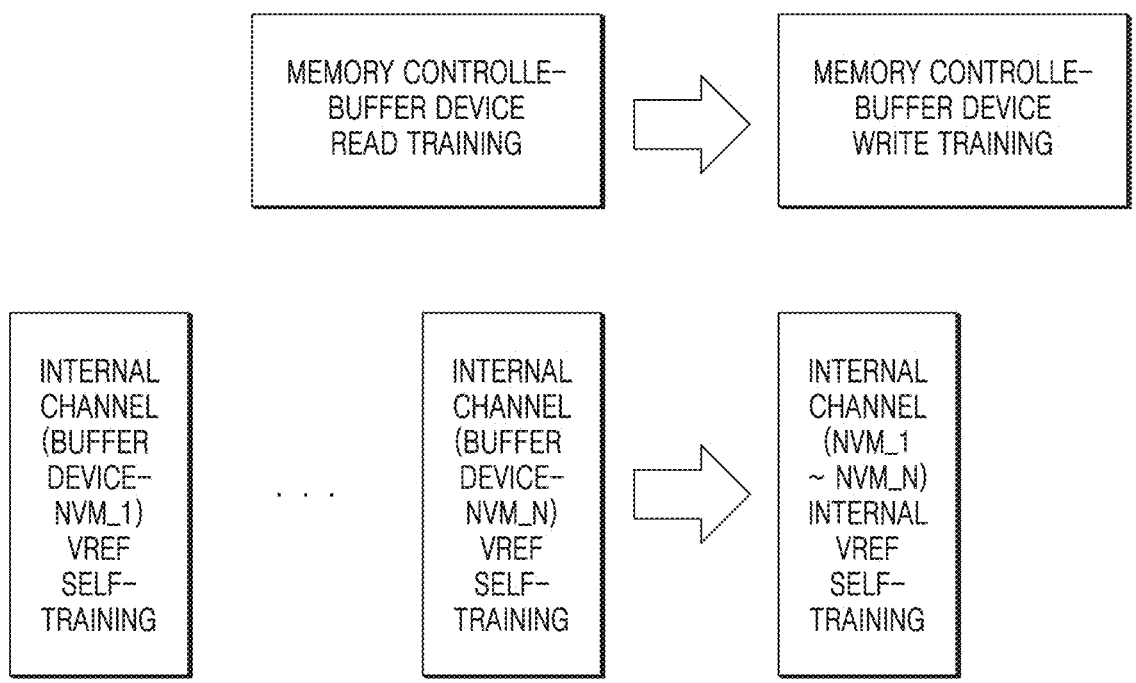
FIG. 10 is a diagram illustrating an internal channel reference voltage self-training operation during a read training operation and a write training operation for a buffer device.

FIG. 10 is a diagram illustrating an internal channel self-training operation during a read training operation and a write training operation for a buffer device. FIG. 10 may be described with reference to FIGS. 1 to 9.

Referring to FIG. 10, during a training operation for the buffer device 120, a write training operation may be performed after a read training operation is performed. In addition, during the read training operation for the buffer device 120, a reference voltage self-training operation may be performed in the buffer device 120. The buffer device 120 may perform a reference voltage self-training operation of an internal channel between each of the nonvolatile memories 110 and the buffer device 120. The buffer device 120 may sequentially perform reference voltage self-training operations for N internal channels. For example, after a reference voltage self-training operation of an internal channel between the buffer device 120 and the first nonvolatile memory 110_1 is performed, a reference voltage self-training operation of an internal channel between the buffer device 120 and the second nonvolatile memory 110_2 may be performed. However, this is only an example, and the order in which the buffer device 120 performs reference voltage self-training operations may vary according to some example embodiments.

During the write training operation for the buffer device 120, each of the nonvolatile memories 110 may perform a reference voltage self-training operation of an internal channel between each of the nonvolatile memories 110 and the buffer device 120. Reference voltage self-training operations of internal channels of respective nonvolatile memories 110 may be performed simultaneously.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As described herein, any electronic devices and/or portions thereof according to any of the example embodiments may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality and/or methods performed by some or all of any devices, systems, modules, units, controllers, circuits, architectures, and/or portions thereof according to any of the example embodiments, and/or any portions thereof.

While the inventive concepts has been particularly shown and described with reference to some example embodiments thereof, it will be understood that various changes in form and details may be made therein without departing from the spirit and scope of the following claims.

What is claimed is:

1. A nonvolatile memory comprising:
a receive buffer configured to generate a buffer signal by comparing an input signal with a reference voltage;
a reference voltage calibrator configured to generate a calibrated reference voltage code signal based on a reference voltage code signal and the buffer signal; and
a reference voltage generator configured to generate the reference voltage based on the calibrated reference voltage code signal,
the reference voltage calibrator comprising a duty cycle monitor configured to generate a monitoring signal by measuring a duty cycle of the buffer signal;
an up/down counter configured to generate a count number signal by comparing a reference duty cycle with a measurement duty cycle corresponding to the monitoring signal; and
a code calculator configured to generate the calibrated reference voltage code signal based on the count number signal and the reference voltage code signal.

2. The nonvolatile memory of claim 1, wherein the receive buffer is further configured to:
generate the buffer signal having a high logic level based on a voltage of the input signal being greater than or equal to the reference voltage; and
generate the buffer signal having a low logic level based on the voltage of the input signal being less than the reference voltage.

3. The nonvolatile memory of claim 1, wherein the up/down counter is further configured to:
generate an up count number signal based on the measurement duty cycle being greater than or equal to the reference duty cycle; and
generate a down count number signal based on the measurement duty cycle being less than the reference duty cycle.

4. The nonvolatile memory of claim 1, wherein the code calculator is further configured to:
calculate a voltage corresponding to the count number signal with respect to a reference voltage corresponding to the reference voltage code signal; and
generate a code corresponding to a result of the calculation as the calibrated reference voltage code signal.

5. The nonvolatile memory of claim 1, wherein the input signal toggles between a high logic level and a low logic level.

6. The nonvolatile memory of claim 1, wherein the reference duty cycle is a duty cycle at which a difference between a high logic level of the buffer signal and a low logic level of the buffer signal is reduced.

7. The nonvolatile memory of claim 1, further comprising an internal circuit configured to perform, based on the buffer signal, at least one of a read operation, a write operation, and an erase operation.

8. A memory system comprising:
a plurality of nonvolatile memories;
a memory controller configured to control operations for the plurality of nonvolatile memories; and
a buffer device connected between the plurality of nonvolatile memories and the memory controller,
each of the plurality of nonvolatile memories comprising
a first receive buffer configured to generate a first buffer signal by comparing a first input signal received from the buffer device with a first reference voltage;
a write reference voltage calibrator configured to generate a first calibrated reference voltage code signal based on a first reference voltage code signal and the first buffer signal, the first reference voltage code signal received from the buffer device; and
a first reference voltage generator configured to generate the first reference voltage based on the first calibrated reference voltage code signal.

9. The memory system of claim 8, wherein the write reference voltage calibrator comprises:
a duty cycle monitor configured to generate a monitoring signal by measuring a duty cycle of the first buffer signal;
an up/down counter configured to generate a count number signal by comparing a reference duty cycle with a measurement duty cycle corresponding to the monitoring signal; and
a code calculator configured to generate the first calibrated reference voltage code signal based on the count number signal and the first reference voltage code signal.

10. The memory system of claim 8, wherein
the memory controller is further configured to perform a write training operation for the buffer device by generating write data, and
each of the plurality of nonvolatile memories is configured to receive the write data as the first input signal during the write training operation.

11. The memory system of claim 8, wherein the buffer device comprises:
a second receive buffer configured to generate a second buffer signal by comparing a second input signal received from each of the plurality of nonvolatile memories with a second reference voltage;
a second reference voltage generator configured to generate the second reference voltage based on a second calibrated reference voltage code signal; and
a read reference voltage calibrator configured to generate the second calibrated reference voltage code signal based on a second reference voltage code signal and the second buffer signal.

12. The memory system of claim 11, wherein
the memory controller is further configured to perform a read training operation for the buffer device by generating a pattern signal,
each of the plurality of nonvolatile memories is configured to generate a read data signal based on the pattern signal, and
the buffer device is configured to receive the read data signal as the second input signal during the read training operation.

13. The memory system of claim 11, wherein the read reference voltage calibrator comprises:
a duty cycle monitor configured to generate a monitoring signal by measuring a duty cycle of the second buffer signal;
an up/down counter configured to generate a count number signal by comparing a reference duty cycle with a measurement duty cycle corresponding to the monitoring signal; and
a code calculator configured to generate the second calibrated reference voltage code signal based on the count number signal and the second reference voltage code signal.

14. The memory system of claim 13, wherein the second receive buffer is further configured to:
generate the second buffer signal having a high logic level based on a voltage of the second input signal being greater than or equal to the second reference voltage; and
generate the second buffer signal having a low logic level based on the voltage of the second input signal being less than the second reference voltage.

15. The memory system of claim 13, wherein the up/down counter is further configured to:
generate an up count number signal based on the measurement duty cycle being greater than or equal to the reference duty cycle; and generate a down count number signal based on the measurement duty cycle being less than the reference duty cycle.

16. The memory system of claim 13, wherein the code calculator is further configured to:
  calculate a voltage corresponding to the count number signal with respect to a reference voltage corresponding to the second reference voltage code signal; and
  generate a code corresponding to a result of the calculation as the second calibrated reference voltage code signal.

17. The memory system of claim 8, wherein each of the plurality of nonvolatile memories further comprises an internal circuit configured to perform at least one of a read operation, a write operation, and an erase operation, based on the first buffer signal.

18. An operating method of a nonvolatile memory, the operating method comprising:
  receiving write data;
  generating a buffer signal by comparing the write data with a reference voltage;
  generating a calibrated reference voltage code signal based on a reference voltage code signal and the buffer signal; and
  generating the reference voltage based on the calibrated reference voltage code signal,
  the generating of the calibrated reference voltage code signal comprising
    generating a monitoring signal by measuring a duty cycle of the buffer signal;
    generating a count number signal by comparing a reference duty cycle with a measurement duty cycle corresponding to the monitoring signal; and
    generating the calibrated reference voltage code signal based on the count number signal and the reference voltage code signal.

19. The operating method of claim 18, wherein the generating of the count number signal comprises:
  generating an up count number signal based on the measurement duty cycle being greater than or equal to the reference duty cycle; and
  generating a down count number signal based on the measurement duty cycle being less than the reference duty cycle.

20. The operating method of claim 18, wherein the generating of the calibrated reference voltage code signal further comprises:
  calculating a voltage corresponding to the count number signal with respect to the reference voltage corresponding to the reference voltage code signal; and
  generating a code corresponding to a result of the calculation as the calibrated reference voltage code signal.

* * * * *